United States Patent
Kreuter et al.

(10) Patent No.: US 9,960,588 B2
(45) Date of Patent: May 1, 2018

(54) POWER SWITCH DEVICE

(71) Applicant: Infineon Technologies AG, Neubiberg (DE)

(72) Inventors: Hans-Peter Kreuter, Villach (AT); Christian Djelassi, Villach (AT); Bernhard Schaffer, Villach (AT)

(73) Assignee: Infineon Technologies AG, Neubiberg (DE)

( * ) Notice: Subject to any disclaimer, the term of this patent is extended or adjusted under 35 U.S.C. 154(b) by 462 days.

(21) Appl. No.: 14/663,126

(22) Filed: Mar. 19, 2015

(65) Prior Publication Data

US 2016/0276819 A1    Sep. 22, 2016

(51) Int. Cl.
| | |
|---|---|
| H02H 1/00 | (2006.01) |
| H02H 9/02 | (2006.01) |
| H02H 9/04 | (2006.01) |
| G01R 31/327 | (2006.01) |

(52) U.S. Cl.
CPC ....... H02H 1/0007 (2013.01); *G01R 31/3275* (2013.01)

(58) Field of Classification Search
CPC .......... H02H 1/0007; H02H 9/02; H02H 9/04; G01R 31/2621; G01R 31/3275
USPC ........................................................ 361/56
See application file for complete search history.

(56) References Cited

U.S. PATENT DOCUMENTS

| | | | |
|---|---|---|---|
| 3,950,656 A | 4/1976 | Sumida et al. | |
| 4,100,429 A | 7/1978 | Adachi | |
| 4,363,978 A | 12/1982 | Heimbigner | |
| 4,375,073 A | 2/1983 | Glogolja et al. | |
| 4,449,065 A | 5/1984 | Davies, Jr. | |
| 4,893,158 A * | 1/1990 | Mihara | H01L 27/0251 257/341 |
| 5,138,516 A | 8/1992 | Chapman | |
| 5,153,809 A | 10/1992 | Murakami | |
| 5,194,766 A | 3/1993 | Sugawara | |
| 5,475,329 A * | 12/1995 | Jones | H03K 17/04206 327/108 |
| 5,498,980 A | 3/1996 | Bowles | |
| 5,714,892 A | 2/1998 | Bowers et al. | |
| 2006/0164118 A1* | 7/2006 | Taguchi | G09G 3/3648 324/760.02 |

FOREIGN PATENT DOCUMENTS

| | | | |
|---|---|---|---|
| EP | 0010882 A1 | 5/1980 | |
| EP | 0045344 A1 | 2/1981 | |
| WO | 9738492 A1 | 10/1997 | |

OTHER PUBLICATIONS

"PROFET™+Current Sense, What the designer should know," Infineon, Application Note, Smart High Side Switches, Rev 1.1, Body Power, Mar. 14, 2014, 34 pp.
"PROFET™+12V BTS5016-2EKA, Smart High-Side Power Switch, Dual Channel, 16mΩ," Infineon, Data Sheet, Rev 1.0, Automotive Power, Jun. 17, 2013, 54 pp.

* cited by examiner

*Primary Examiner* — Thienvu Tran
*Assistant Examiner* — Kevin J Comber
(74) *Attorney, Agent, or Firm* — Shumaker & Sieffert, P.A.

(57) ABSTRACT

Devices and methods are provided which comprise detecting an irregular condition at a control terminal of a power switch device.

19 Claims, 6 Drawing Sheets

POWER SWITCH DEVICE

TECHNICAL FIELD

The present application relates to power switch devices and to corresponding methods

BACKGROUND

Power switches are conventionally used to couple a load with a supply voltage. In recent years, "smart" power switch devices have been developed which are equipped with one or more diagnostic abilities and protection features, for example against overload and short circuit events. For example, in such power switch devices as a power switch a MOS transistor may be used, and the switch may be opened (i.e. caused to be non-conducting between terminals of the switch) in case of overload or short circuit events.

Power switch devices may comprise one or more control terminals. One of such control terminals may for example control opening and closing of the power switch. Another one of the control terminals may for example serve to set a desired mode (for example to enable a diagnosis mode).

Power switch devices may comprise diagnosis functions, for example to detect fault conditions like overcurrent, overvoltage, overheating or a broken load. In case such a fault condition is detected, a fault signal (for example a fault current) may be output to signal fault conditions to other entities, for example to other entities in a system including the power switch.

However, for example a faulty connection to the above-mentioned control inputs may cause a misinterpretation of such a fault signal or other signal output. For example, when a connection to a control input usable to set the power switch to a diagnosis mode is broken, another entity may erroneously believe that the power switch is set to a diagnosis mode, while it is still a normal operation, and may misinterpret signals output accordingly.

DETAILED DESCRIPTION

Figure 1:
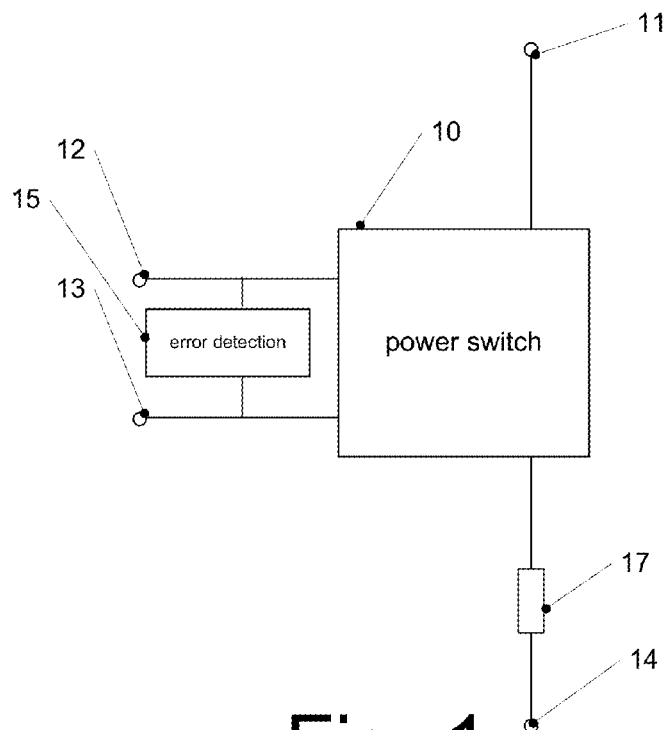
FIG. 1 is a simplified block diagram of a power switch device according to an embodiment.

In the following, various embodiments will be described in detail with reference to the attached drawings. It is to be noted that these embodiments serve as illustrative examples only and are not to be construed as limiting the scope of the present application. For example, while an embodiment may be described as comprising a plurality of features or elements, this serves illustration purposes only, and in other embodiments some of these features or elements may be omitted and/or replaced by alternative features or elements. Furthermore, in some embodiments additional features or elements in addition to those described or shown in the drawings may be provided without departing from the scope of the present application. Also, features or elements from different embodiments may be combined with each other to form further embodiments.

Any connections or couplings, in particular electrical connections or couplings, shown in the drawings or described herein may be implemented as direct connections or couplings, i.e. as connections or couplings without intervening elements, or as indirect connections or couplings, i.e. connections or couplings with one or more intervening elements, as long as the general function of the connection or coupling, for example to transmit a certain kind of information or signal, is essentially maintained. Connections or couplings may be implemented as wire-based connections or couplings or as wireless connections or couplings, or mixtures thereof.

Generally, in the context of the present application power switches may be described as comprising one or more control terminals and two or more load terminals. An opening and closing of the power switch may be controlled by applying one or more signals to at least one of the one or more control terminals. When the power switch is closed, it provides a low-ohmic connection between at least two of its load terminals, such that current may flow between the load terminals. When the switch is opened, the power switch exhibits a blocking behavior between its load terminals, i.e. is high-ohmic, such that essentially no current may flow between the load terminals (with the exception of undesired effects like leakage current etc., which may occur in real devices). For example, one load terminal may be coupled to a load, and another load terminal may be coupled to a supply voltage, to selectively couple the load with the supply voltage via the power switch. The closed state is also referred to as an on-state of the switch, and the open state is also referred to as off-state.

In some embodiments, the power switch may be implemented using a field effect transistor like a MOS transistor. In this case, the load terminals may correspond to source and drain terminals of the MOS transistor, and a control terminal used for opening and closing the switch may correspond to a gate terminal. In other embodiments, a power switch may be implemented using a bipolar transistor. In such a case, load terminals may correspond to emitter and collector terminals, and a control terminal used for opening and closing the switch may correspond to a base terminal.

As will be explained further below in more detail, a power switch may also comprise control terminals (e.g. in addition to a control terminal used for opening and closing the switch), for example a diagnosis enable terminal or a diagnosis select terminal, as well as an output terminal. For example, in some embodiments, the output terminal, when diagnosis is enabled, may output a measure of a load current, i.e. a measure of current flowing via the load terminals of the power switch. In case a fault condition like overvoltage, or overcurrent or overheating is detected, a signal indicating an error may be output at the load terminal.

In some embodiments, one, all or some of control terminals are monitored to detect a high impedance state, e.g. a state where the control terminal and/or additional control terminals are not driven or disconnected. In such a case, in embodiments a signal indicating an error may be output at an output terminal.

Turning now to the figures, FIG. 1 illustrates a simplified block diagram of a power switch device according to an embodiment. The power switch device of FIG. 1 may be integrated on a single chip, but may also be provided as a multi-chip device, for example in a multi-chip package. The power switch device illustrated in FIG. 1 comprises a power switch 10, for example a MOS transistor. Power switch 10 comprises a first load terminal, which may for example be coupled to a supply voltage 11, and a second load terminal, which may for example be coupled to ground 14 or a further supply voltage 14 via a load 17. When power switch 10 is closed, load 17 is connected to supply voltage 11.

Power switch 10 may further comprise one or more control terminals. As an example, a control terminal 12 is shown. Furthermore, an error detection circuit 15 is provided which may be configured to detect an error condition at control terminal 12, for example a non-driven state (i.e. a state where no signal is applied to the control terminal) or a state where a line 2 control terminal 12 is broken. Such error states may effectively correspond to a high impedance at control terminal 12. Upon detection of such an error condition, error detection circuit 15 causes an error signal co be output at an output terminal 13. In some embodiments, error detection circuit 15 may be coupled to or provided together with an input buffer for control terminal 12. In normal operation, output terminal 13 may for example be used to output a measure of a load current flowing through load 17 via power switch 10. Details and examples of such circuits will be described later.

Figure 2:
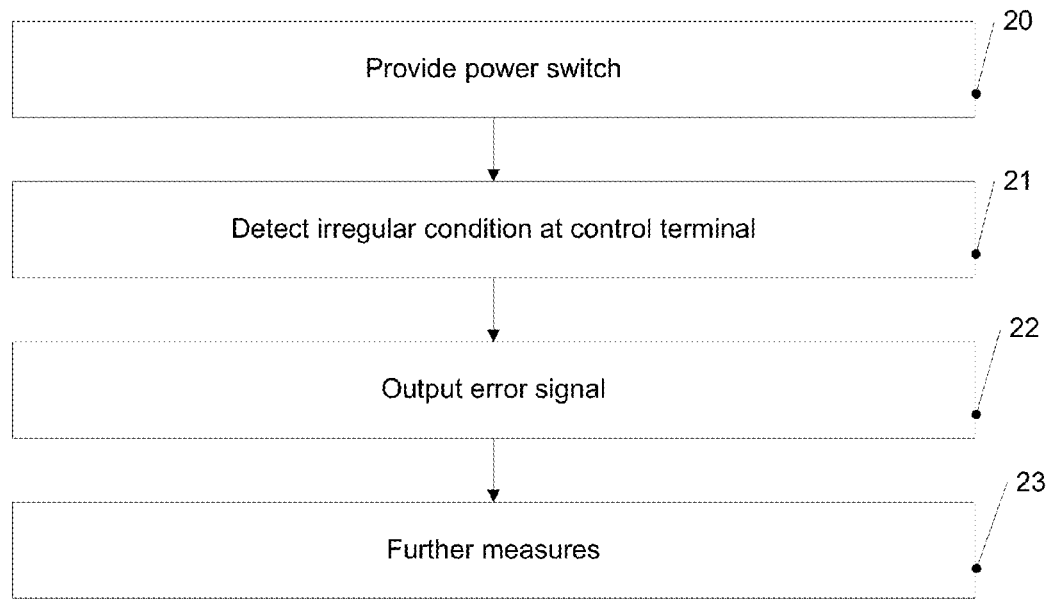
FIG. 2 is a flow chart illustrating a method according to an embodiment.

FIG. 2 illustrates a method according to an embodiment. While the method is depicted and will be described as a series of acts or events, the order in which such acts or events are described is not to be construed as limiting. In particular, in other embodiments the order may differ, and/or acts or events may be performed simultaneously with each other, for example by different parts of a circuit or device.

The method illustrated in FIG. 2 may for example be implemented using the power switch device discussed with reference to FIG. 1 or may be implemented using power switch devices as discussed later, but is not limited thereto.

At 20 in FIG. 2, a power switch device is provided. The power switch device may comprise two or more load terminals and may further comprise one or more control terminals.

At 21, the method comprises detecting an irregular condition at a control terminal of the power switch device. The irregular condition may comprise a high impedance condition, for example due to a non-driven or disconnected control terminal.

At 22, in response to detecting the irregular condition an error signal is output by the power switch, for example to inform a further entity like a microcontroller of the error.

At 23, optionally further measures may be taken in response to detecting the irregular condition, for example setting the power switch to a predefined state (for example open state) or other safe state.

Next, various power switch devices in which the concepts, techniques and method discussed above may be implemented will be discussed.

Figure 3:
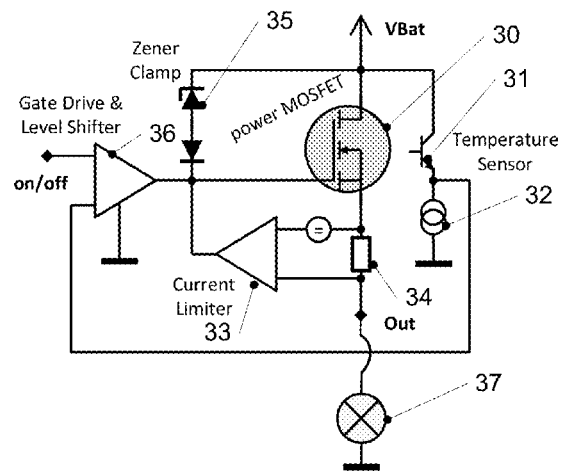
FIG. 3 is a diagram illustrating some components of power switch devices according to embodiments.

In FIG. 3, a power switch device comprising a power switch and various circuitry associated with the power switch is shown. The power switch device of FIG. 3 may form the basis of various embodiments.

The power switch device of FIG. 3 comprises a MOSFET 30 acting as a power switch to selectively couple a supply voltage, for example a battery voltage VBat, with a load, which load in case of FIG. 3 is represented by a light bulb 37. A gate terminal of power MOSFET 30 is coupled to an output of a gate driver and level shifter 36. Via gate driver and level shifter 36, using an on-off signal the switch may be selectively turned on or off, an "on" state in the context of the present application corresponding to a closed state, and an "off" state corresponding to an open state.

Gate driver and level shifter 36 additionally receives a signal from a temperature sensor, which in the example of FIG. 3 is formed by a transistor 31 and a current source 32. Transistor 31 may be a bipolar transistor, PN junctions of which change their behavior with changing temperature. In other embodiments any other conventional implementation of a temperature sensor may be used.

Furthermore, the power switch device of FIG. 3 comprises a current limiter 33. Current limiter 33 receives a measure of a current flowing via the load terminals of power MOSFET 30 by measuring a voltage drop across a sense resistor 34 and may control the gate terminal of power MOSFET 30 to prevent an overcurrent. Other circuitry may also be provided, for example shunt resistors for current limitation. Furthermore, a Zener diode clamp 35 is provided as an overvoltage protection. It should be noted that the shown power switch devices serve only illustrative purposes, and in other power switch devices, for example only some of the features or elements shown and/or alternative features or elements may be provided.

Figure 4:
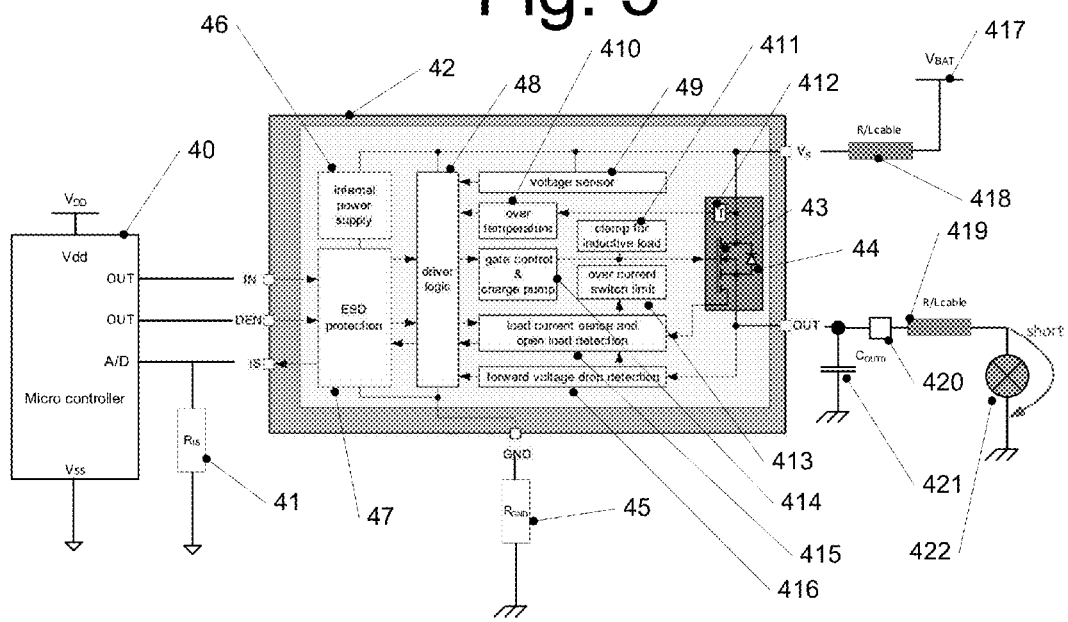
FIG. 4 illustrates a power switch device according to an embodiment.

In FIG. 4, a further example of a power switch device serving as a basis for embodiments is shown together with associated circuitry. In the example of FIG. 4, a power switch device 42 comprises a power MOSFET 43 as a power switch, which in the example of FIG. 4A serves to couple a supply voltage, for example a battery voltage, 417 with a load 422. In the example of FIG. 4, load 422 is represented by a light bulb symbol, although other loads may be used as well.

An impedance, in particular resistance and/or inductivity, of a wiring from supply voltage 417 to a supply voltage input of power switch device 42 is labeled 418 in FIG. 4A, and an impedance, for example resistance and/or inductivity, of a wiring from an output pad 420 of power switch device 42 to load 422 is labeled 419 in FIG. 4. All elements of power switch device 42 in some embodiments may be implemented on a single chip die, although other embodiments may use more than one chip die. Additionally, an output capacitance 421 may be provided, and power switch device 42 may be coupled to ground via a resistor 45 in some embodiments.

Power switch device 42 may be controlled by a microcontroller 40, which may be coupled with power switch device 42 as shown, including a resistor 41 in the coupling. However, this merely serves as an example.

Signals from microcontroller 40 are provided to a driver logic 48 of power switch device 42 via an ESD protection circuitry 47. Driver logic 48 controls a gate control and charge pump 414, which in turn controls a gate terminal of power MOSFET 43.

For example, in FIG. 4 microcontroller 40 controls power switch device 42 via a terminal labeled IN to close and open power MOSFET 43, and furthermore controls power switch device 42 via a terminal DEN to output a diagnosis signal (for example a signal indicating a magnitude of a load current) via an output terminal labeled IS. Terminals IN and DEN are examples for control terminals as used herein.

Furthermore, power switch device 42 in the embodiment shown comprises a temperature sensor 412, for example as shown in FIG. 3, to detect an overtemperature event by an overtemperature detection circuit 410. Overtemperature detection 410 is coupled to driver logic 41 and may for example control driver logic 48 to open power MOSFET 43 in case of an overtemperature being detected.

Furthermore, the power switch 42 of the embodiment of FIG. 4 comprises a load current sense and open load detection circuit 415, which may sense a load current. Depending on the load current, driver logic 48 may be controlled to open or close the switch. Furthermore, an overcurrent switch limit 413 may be set upon reaching of which switch 43 may for example be opened. This function may for example correspond to current limiter 33 of FIG. 4.

Furthermore, the power switch device of FIG. 4 may comprise a voltage sensor 49 for monitoring supply voltage 417 and controlling driver logic 48 in response thereto, and a forward voltage drop detection 416 to detect a voltage drop across power switch 43 and again to control driver logic 48 in response thereto.

Transistor 43 may have a reverse bias diode 44, either in form of a parasitic diode or in form of a deliberately implemented diode, coupled in parallel to its source and drain terminal, which may form a dissipation path in case of shutdowns. For example, in case of a short circuit of load 422 as illustrated by an arrow in FIG. 4, a high current may be sensed, and overcurrent switch limit 413 may control power switch 413 to open, also referred to as emergency shutdown. In this case, energy stored in inductivities 418, 419 may discharge via diode 44. This in some cases may lead to a comparatively high temperature of power switch 43.

Figure 5:
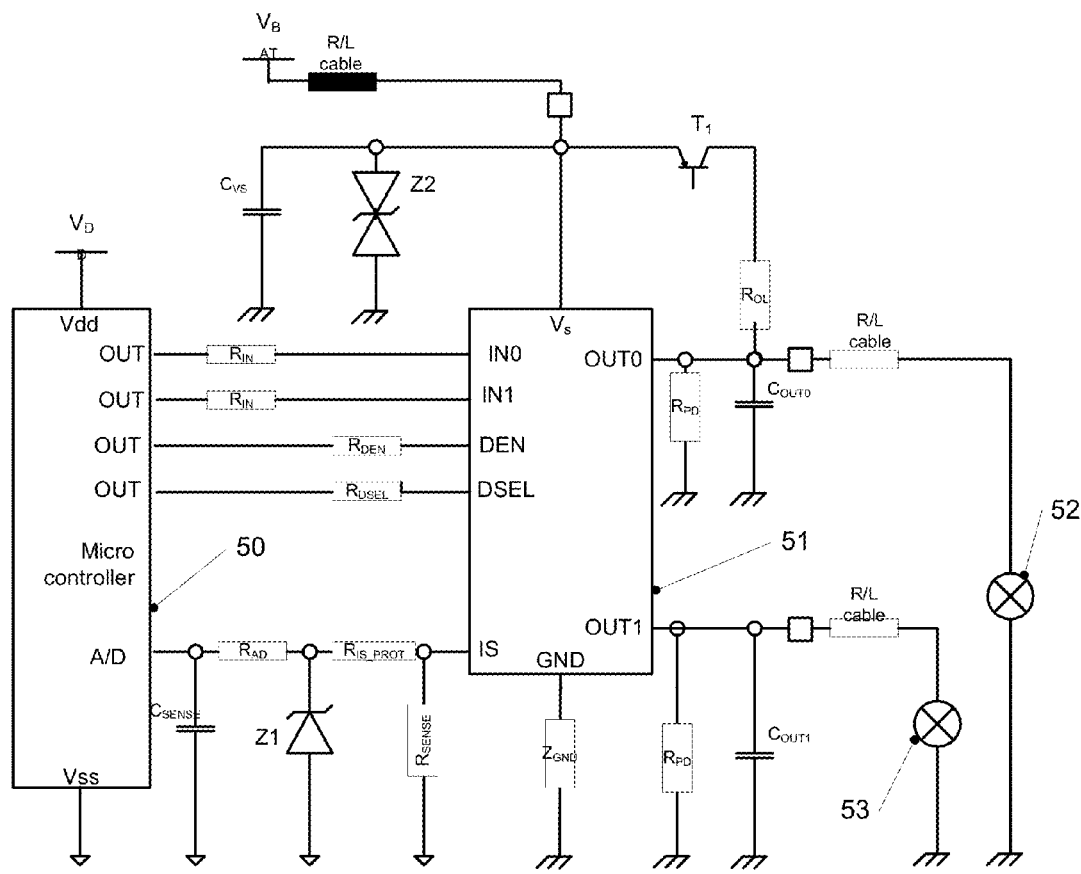
FIG. 5 illustrates a power switch device according to a further embodiment.

FIG. 5 illustrates a further example of a power switch device according to an embodiment controlled by a microcontroller.

In the previously described embodiments, e.g. FIG. 3 or 4, power switches having a single channel have been illustrated, i.e. power switches usable to switch a single load. In other embodiments, power switches having more than one channel may be used. An example for such a power switch device is illustrated in FIG. 5. The arrangement of FIG. 5 comprises a power switch device 51, which may be similar to power switch device 42 illustrated with respect to FIG. 4 with the exception that two output channels OUT0, OUT1 for selectively coupling two loads 52, 53 to a positive supply voltage are illustrated. Various resistors and capacitors may be provided as illustrated. Furthermore, Zener clamps Z1, Z2 are provided in the example of FIG. 5. The resistors, capacitances and also transistor $T_1$ shown in FIG. 5 serve merely as an example, and other elements may also be used. Some of the resistances, like R/L cable illustrated in FIG. 5, may represent resistances or inductivities coupling power switch 51 with loads 52, 53 and with positive supply voltage $V_B$.

Power switch device 51 is controlled by a microcontroller 50 which may essentially correspond to microcontroller 40 of FIG. 4 with the exception that is has more output channels. Likewise, power switch device 51 has two input terminals IN0, IN1 to separately control the switching on and off of the two loads 52, 53, and a terminal DSEL where a diagnosis (enabled by pin DEN) may be selected between the two channels. Generally, all techniques and embodiments described before may also be applicable to such a power switch device with two channels (or more than two channels).

In the example of FIG. 5, terminals IN0, IN1, DSEL and DEN are examples for control terminals as used herein.

Figure 6:
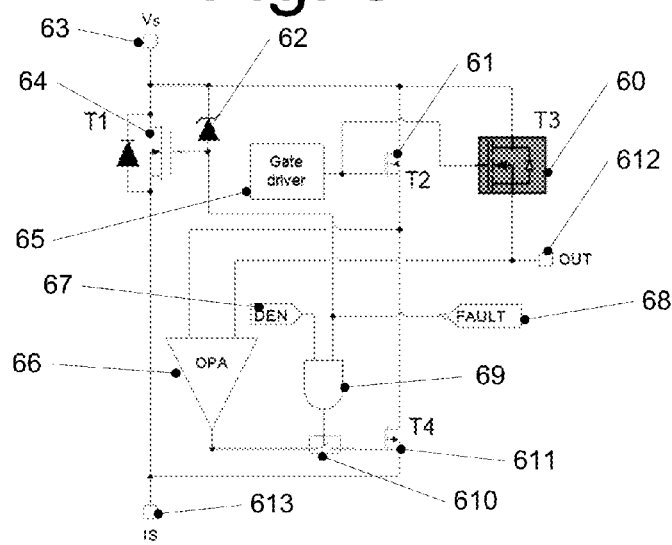
FIG. 6 illustrates a diagnosis circuit usable in some embodiments.

FIG. 6 shows an example of a diagnosis interface for outputting one of a fault information or a measure of a load current usable in power switch devices according to some embodiments. In FIG. 6, 60 denotes a power MOSFET that selectively couples a first load terminal 63, for example to be coupled with a supply voltage $V_S$, with a second load terminal 612, for example to be coupled to a load. A gate terminal of power MOSFET 60 is controlled by a gate driver 65, which in turn may be controlled by a control signal supplied to an input terminal (like IN in FIG. 4 or IN0, IN1 in FIG. 5). Numeral 61 denotes a current sense transistor which in embodiments is scaled compared to MOSFET 60 and which also is controlled by gate driver 65. The scaling factor (size ratio) between transistors 61, 60 determines a mirror transformation ratio, i.e. a ratio between a current output at a terminal 613 (IS) as a measure of the load current and a current flowing through transistor 60. This scaling factor is also referred to as KILIS factor or proportional factor k of IL (load current) to IS. A transistor 64 supplies a fault current to pin 613 in case a fault condition is determined. A corresponding fault signal may be supplied by a terminal 68 (for example by an overcurrent detection, an overtemperature detection, an overvoltage detection or a detection of an irregular state at a control terminal as will be discussed later).

Numeral 67 denotes a diagnosis enable pin. In normal operation, when an enable signal is supplied to DEN terminal 67, a switch 610 is closed, and a current scaled with the above KILIS factor with respect to the load current is supplied to terminal 613 via a transistor T4 controlled via an operational amplifier 66 as shown. In case of a fault condition, via a logic gate 669 irrespective of the DEN enable signal at terminal 67 switch 610 is opened, and a current indicating an error is supplied to terminal 613 via transistor 64. The current indicating an error (error signal) may be significantly higher than any current at terminal 613 being a measure for a load current, such that an error condition may be reliably distinguished from a regular load current flowing.

Figure 7:
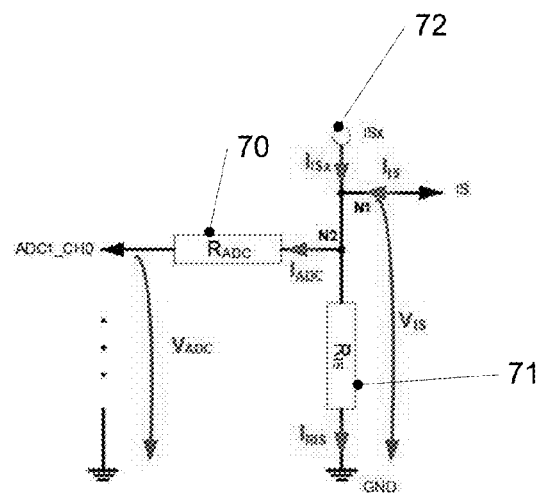
FIG. 7 illustrates a current sense resistor network.

FIG. 7 shows an example for a resistive network coupled to a IS terminal for example as shown in FIG. 6. A further example for a resistive network is illustrated in FIG. 5. The resistive network comprises a first resistor 71 coupled between an IS terminal 72 (for example terminal 613 of FIG. 6) and ground, and a second resistor 70. First resistor 71 serves to convert the current output at terminal 72 to a voltage $V_{IS}$ which may then for example be sampled by an analog-to-digital converter of a microcontroller, the voltage being supplied via second resistor 70. A corresponding example of an input of a microcontroller is labeled A/D in FIGS. 4 and 5.

With the circuit of FIGS. 6 and 7 without detection of an irregular condition of control terminals (for example high impedance condition which may indicate a non-driven or disconnected state), it may happen that no load current is measured via the IS pin (as for example the DEN terminal 67 of FIG. 6 cannot be enabled due to a broken connection, while in fact a load is driven and a load current is flowing). Furthermore, with the circuit of FIG. 6 alone it may be difficult to test a fault condition (e.g. outputting a fault signal) without a specific test mode or external components when operating the power switch device in an application. However, by some functional safety requirements for example in the automotive field, a self-test at power up of the power switch device may be required for some functions.

Therefore, in some embodiments as discussed above and as will be discussed in more detail later, irregular conditions like a high impedance state on one or more control terminals of the power switch device are detected, and a fault condition may be indicated in case of detection of an irregular condition.

Figure 8:
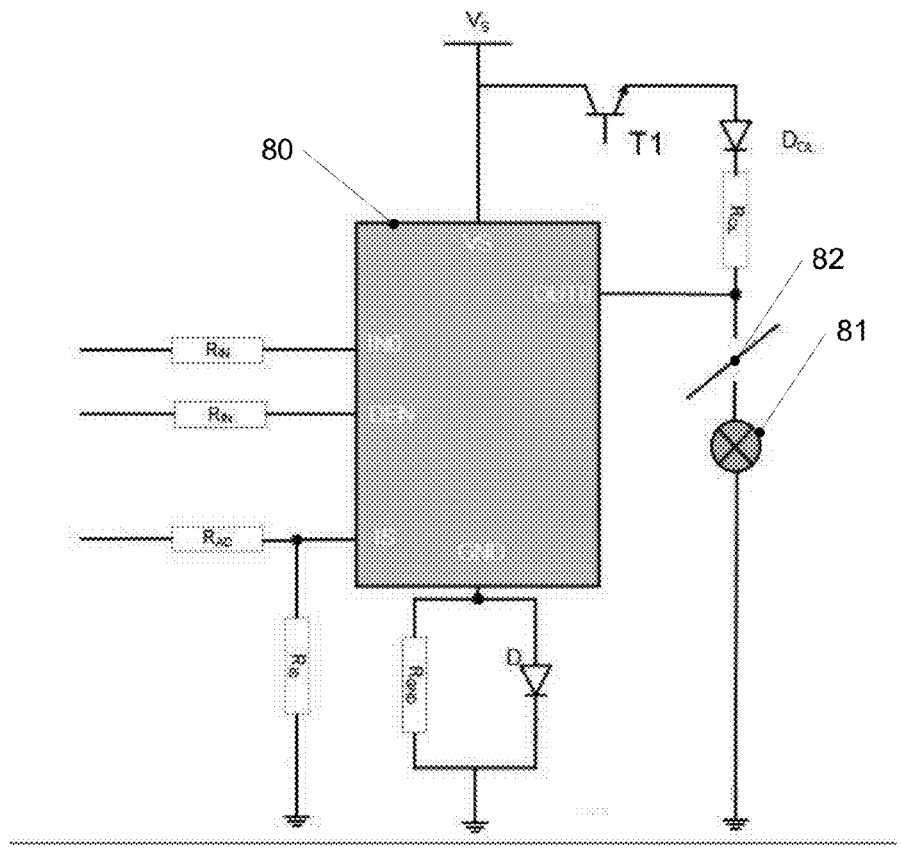
FIG. 8 illustrates an open load test.

Regarding the testing of a fault condition (e.g. voluntarily outputting a fault signal for testing purposes), in principle, as illustrated in FIG. 8, a load 81 coupled to a power switch device 80 may be disconnected for example via a switch 82 such that a fault current is generated (e.g. at IS terminal) for testing purposes. However, provision of such an additional switch may be undesirable for example for cost reasons. In embodiments, by detecting an erroneous condition of a control terminal of a power switch, a fault current may also deliberately be generated for testing purposes for example by controlling a microcontroller controlling the power switch device (for example microcontroller 40 of FIG. 4 or 50 of FIG. 5) to provide a high impedance or undriven state. In this way, in some embodiments a self-test may be easily implemented.

Figure 9:
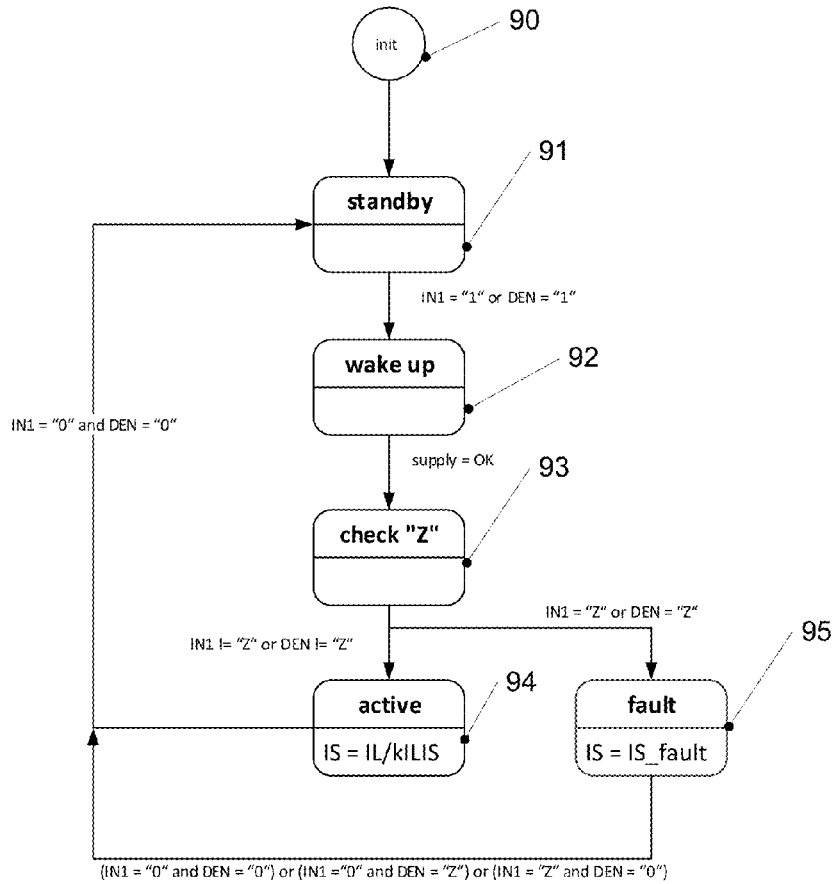
FIG. 9 is a state diagram illustrating operation of a device and method according to an embodiment.

FIG. 9 illustrates a state diagram, which may also be regarded as a flow chart illustrating a method, illustrating operation of a power switch device according to some embodiments. In the illustrative example of FIG. 9, a power switch device comprising one channel (as for example illustrated in FIG. 4) is assumed. However, the techniques illustrated in FIG. 9 may also be applied to power switch devices comprising two or more channels, for example the power switch device of FIG. 5.

Numeral 90 denotes an initial state of a power switch device. After the initial state the power switch device in the embodiment of FIG. 9 enters a standby mode 91. The power switch device, from the standby mode, may be activated by applying a signal to an input pin (e.g. IN) or diagnosis enable pin (e.g. DEN) or another control terminal in case other power switch devices are used. In the example of FIG. 9, for illustrative purposes IN and DEN are used as control terminals. In the example of FIG. 9, a value of "1" is used to indicate such an enabling control signal. When such a signal is present, the power switch device enters a wake-up mode at 92. During wake-up mode for example internal supplies of the power switch device are switched on. When the supplies are ok, the power switch device enters a check "Z" mode at 93. In this mode, the power switch devices checks impedances of control terminals like IN or DEN terminals depending on the wake-up condition. In other words, a check for a high impedance state at these terminals which may indicate for example a non-driven state or broken line is performed. If no such high impedance state, which is an example for an erroneous or irregular condition, is detected, the device transitions to an active state 94. In the active state, at a terminal IS a current corresponding to a load current IL divided by the KILIS factor, may be output, for example upon enabling of the DEN terminal, and the power switch may be opened and closed as required by a particular application. However, if in state 93 a high impedance state is detected, the power switch device transitions to a fault state 95, where a fault current may be output (for example as illustrated and explained with reference to FIG. 6). In other embodiments, a fault condition may be communicated in a different manner. Furthermore, in case a fault is detected the power switch device may be set to a predetermined state, for example open or closed depending on an application.

From active mode, when both control terminals (IN1 and DEN in the example of FIG. 9) are set to zero, the device transitions to standby mode 91. From fault mode, the device may transition to a sleep mode also when one of the two control terminals is still in a high impedance state and the other one of the control terminals is set to zero. In both these cases, for example no current measure is expected to be output, and therefore in some applications the device may transition to standby mode 91.

In some embodiments, solutions as illustrated for example in FIG. 9 or as discussed herein elsewhere, may have the advantage that a high impedance condition or undriven condition (for example due to an open series resistor or open wire at a control terminal) may be detected by another entity, for example the above-captioned microcontroller. Furthermore, as already mentioned in some embodiments it may be possible to generate the fault signal (for example at IS pin) without any test modes or external components when operating the power switch device in an application for testing purposes. For example, an inline self-test for a fault detection in embodiments may be implemented at power up. For example, an impedance of an input/output pin coupled to a control terminal in many conventional microcontrollers may be changed by changing it from an output terminal to an input terminal (changing the pin or port direction) during the self-test routine, such that providing a high impedance state is easy to implement. Such a generation of a fault signal during a self-test may be required by some functions due to functional safety requirements.

Furthermore, as already mentioned above, during such a detected fault conditions, a safe state may be entered where the power switch is locked in an on-state or off-state.

Figure 10:
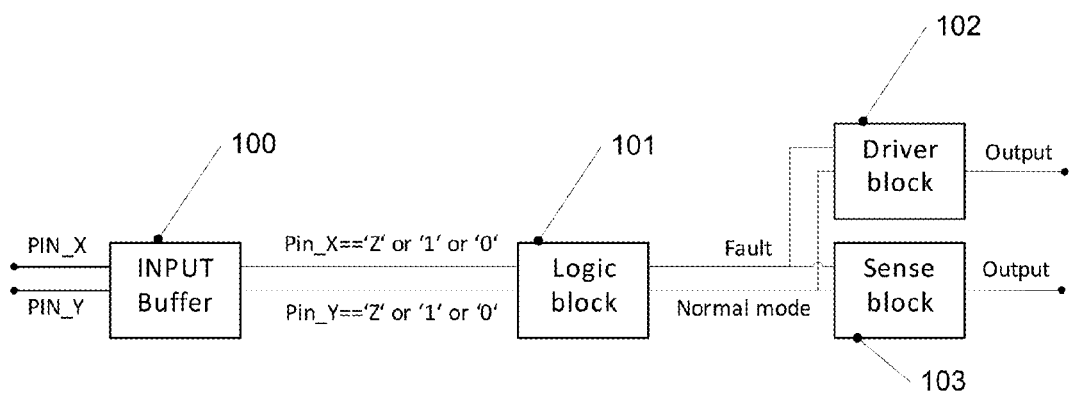
FIG. 10 is a block diagram illustrating part of a power switch device according to an embodiment.

FIG. 10 illustrates a schematic block diagram of parts of a power switch device according to an embodiment.

The device of FIG. 10 comprises an input buffer 100 coupled for example to control terminals, labeled PIN_X and PIN_Y in FIG. 10 and also in FIGS. 11 and 12 which will be explained later. PIN_X and PIN_Y may for example be a control terminal controlling opening and closing of a power switch (like IN terminals discussed above), diagnosis enable terminals (like DEN terminals discussed above), or diagnosis select terminals (like the DSEL terminals discussed above). In other embodiments, other control terminals may be used.

Input buffer 100 is configured to detect a high impedance state at pins X, Y. The high impedance state is labeled "Z" in FIG. 10, while normal states are labeled "1" and "0". This serves only as an example. Examples for suitable input buffers configured to detect a high impedance state will be discussed later with reference to FIGS. 11 and 12. The information about the control terminals (for example high impedance state) is provided to a logic block 101. Logic block 101 may for example implement the state machine illustrated and discussed with reference to FIG. 9. Logic block 101 may for example be implemented in hardware, software, firmware or combinations thereof. For example, the state machine of FIG. 9 may be implemented in logic block 101 by programming a processor accordingly or by implementing a suitable application specific integrated circuit (ASIC), but is not limited thereto.

The information regarding the state (e.g. fault at 95 of FIG. 9 or active at 94 of FIG. 9) is provided to a driver block 102 and a sense block 103. Sense block 103 may provide a corresponding output current at an output terminal, for example a measure of a load current or an error current. An example for such an output terminal is the terminal IS discussed above. Sense block 103 may for example be implemented as discussed with reference to FIG. 6, to give a non-limiting example.

Furthermore, information regarding fault or normal mode is provided to a driver block 102. Driver block 102 may for example comprise a gate driver and level shifter as illustrated in FIG. 3 and/or components as illustrated in FIG. 4. Driver block 102 may control for example a gate terminal of a power MOSFET or control terminal of another switch depending on a control signal (for example at terminal IN) in normal mode, and may set the power switch to a predefined condition (open or close) in case of a fault.

Next, with reference to FIGS. 11 and 12 possible implementation of input buffers and associated circuits to detect a high impedance condition at a control terminal will be discussed with reference to FIGS. 11 and 12. The implementations of FIGS. 11 and 12 serve only as examples, and other implementations may also be used.

Figure 11:
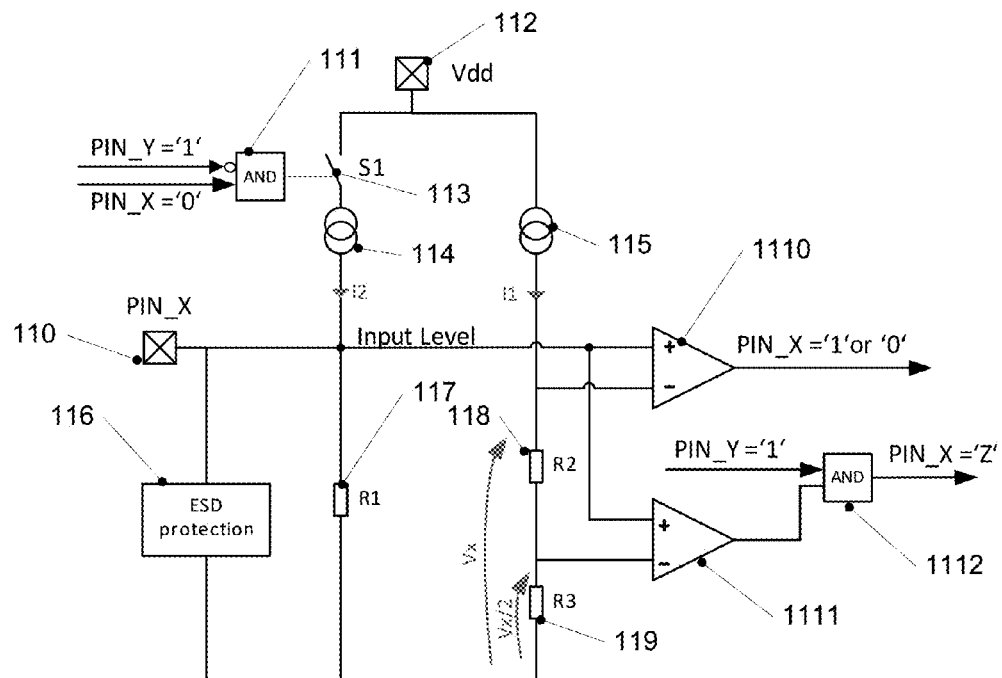
FIG. 11 is a circuit diagram illustrating part of a power switch device according to an embodiment.

The circuit illustrated in FIG. 11 comprises a control terminal 110 (PIN_X). Terminal 110 may for example correspond to a control terminal like terminals IN, DEL or DSEL discussed previously 116 denotes an ESD protection circuit protecting terminal 110. Any conventional implementation of an ESD (electrostatic discharge) protection circuit may be used. 112 denotes a supply voltage terminal for example for a positive supply voltage like VDD. Furthermore, the circuit of FIG. 11 comprises current sources 114, 115 generating currents I2, I1, respectively, a resistor 117 having a resistance value R1, a resistor 118 having a resistance value R2 and a resistor 119 having a resistance value R3 which are coupled as shown. In some embodiments, in FIG. 11 resistance values of resistors 117, 118 and 119 may be essentially the same (i.e. R1=R2=R3), although in other embodiments different values may be used. A switch S1 is coupled between current source 114 and voltage supply terminal 112 and is controlled by an output of an AND gate 111 receiving signals from terminal 110 (PIN_X) and a further control terminal (referred to as PIN_Y). Gate 111 is configured such that switch S1 will be closed when PIN_Y=1 and PIN_X=0. When both control signals are 0, in an embodiment the power switch may be open and no diagnosis is required. Also, in a standby case, terminal 110 is at zero due to resistor 117 acting as pull-down resistor coupling terminal 110 with ground. In the embodiment of FIG. 12, to change terminal 125 to a logic one, a microcontroller has to pull terminal 110 above a voltage Vx=I1(R2+R3).

As mentioned above, if the value of PIN_Y=1 and PIN_X=0, switch S1 is closed. In this case, current I2 tries to pull up a voltage level a terminal 110 to Vx/2=I2·R1.

This pulling up will be successful if terminal 110 is in a high impedance state. In this case, a comparator 111 comparing the voltage at terminal 110 with Vx/2 will output a value of "1", and an end gate 1112 will then (in case PIN_Y=1) output a logic one indicating a high impedance state of terminal 110. In contrast thereto, when the pull-up through current I2 is not "successful", i.e. terminal 110 stays at zero because terminal 110 for example is driven to zero by a microcontroller, the signal output by end gate 1112 will stay at a low level of zero.

Furthermore, comparator 110 outputs a value of one or zero corresponding to a state of terminal 110.

Therefore, based on the state of PIN_X and PIN_Y, that is the states of the two control terminals used as an example in FIG. 11, the following states may be evaluated or determined:
  all pins are in a defined condition, for example low or high (zero or one),
  one pin is floating (high impedance state) while the other terminal is high.

It should be noted that a circuit as illustrated in FIG. 11 may be provided for only one control terminal, but may also be provided to a plurality of control terminals.

It also should be noted that as mentioned above, in some embodiments, a case where both control terminals are zero, may not need to be evaluated. For example, in the state machine of FIG. 9 this would correspond to a standby condition (state 91).

In other embodiments a high impedance state may also be determined by exchanging the functions of pulling up and pulling down in FIG. 11.

Figure 12:
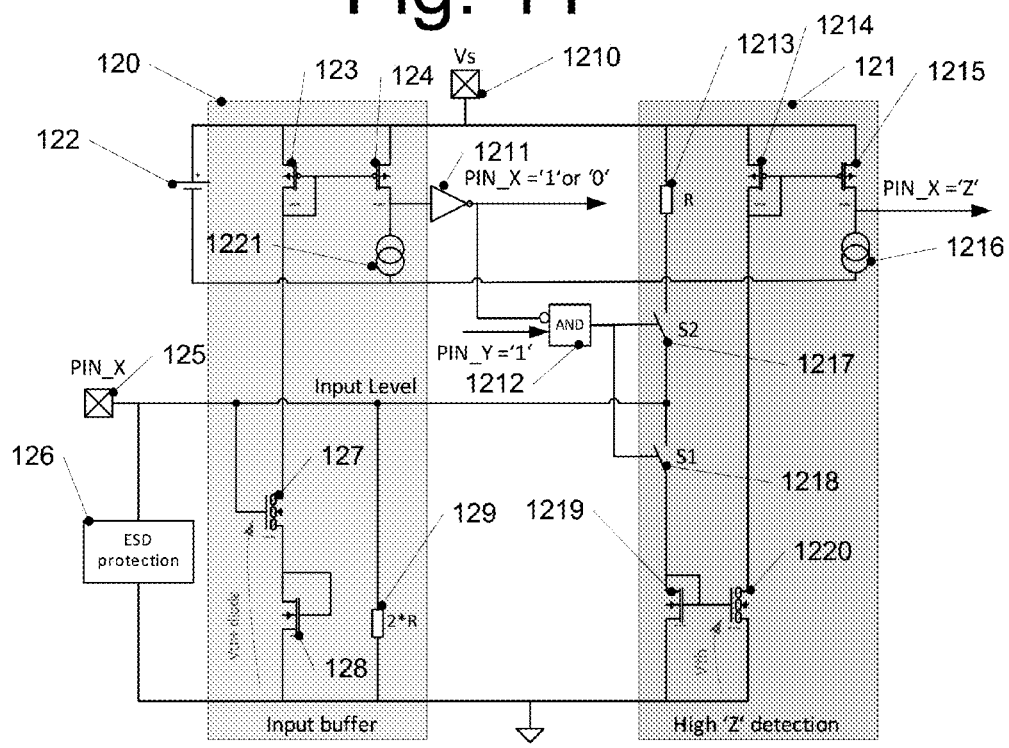
FIG. 12 is a circuit diagram illustrating part of a power switch device according to an embodiment.

FIG. 12 illustrates a further circuit example which may determine a high impedance state (PIN_X="Z"), a high state (PIN_X=1) or a low state (PIN_X=0) of a terminal 125 (PIN_X). Similar to the embodiment of FIG. 11, the detection of a high impedance state is performed when a signal at another control terminal is high (PIN_Y=1), as determined by logic gate 1212. The circuit of FIG. 12 comprises a buffer stage 120 and a high impedance detection stage 121. The circuit of FIG. 12 is supplied via a positive supply voltage terminal 1210. 126 denotes an ESD protection circuit protecting terminal 125 against electrostatic discharge. Any conventional implementation of an ESD protection circuit may be used.

The input buffer stage 120 further comprises current mirror transistors 123, 124, a current source 1221, and transistors 127, 128 as shown. Other configurations are also possible.

Furthermore, the input buffer stage comprises a resistor 129, which may have a value 2·R. In a standby condition, terminal 125 is pulled down to zero by resistor 129.

To change the status of PIN_X to "1", a microcontroller or other entity has to apply a signal to terminal 125 correspondingly to pull it to one which is minimum one MOS diode plus one threshold voltage (of transistors 127, 128 of FIG. 12).

If now, similar to the case of FIG. 11, PIN_Y=1 and PIN_X=0, via gate 1212 switches 1218, 1217 of high impedance detection stage 121 are closed. The same explanations as already made for FIG. 11 may also apply to FIG. 12 regarding the choice of PIN_Y=1 and PIN_X=0. In this case, a pull-up resistor 1213 tries to pull up the level on terminal 125. Pull-up resistor 1213 in embodiments has a smaller resistance value, for example a resistance value R, compared to resistor 129 (for example half the resistance) such that the pulling-up by resistor 1213 is "stronger" than the pull-down of resistor 129. Additionally, by the other elements in high impedance detection stage 121, including transistors 1219, 1220, an input level voltage is clamped to one MOS diode threshold Vth, such that the "normal" input buffer (1211) cannot be activated during the high impedance testing.

If terminal 152 is at a high impedance, resistor 1213 will pull up the voltage, which via a current mirror 1214, 1215 and transistors 1219, 1220 also representing a current mirror configuration leads to an "high" output signal, indicating PIN_X="Z" (i.e. indicating a high impedance state). If, on the other hand, terminal 125 is not pulled up via resistor 1213 for example because it is driven by an external microcontroller (no high impedance state), PIN_X will remain at a low level. Therefore, a high impedance state may be recognized. Otherwise, buffer 1211 outputs the value of the signal at terminal 125 (PIN_X="1" or "0").

It should be noted that the values of 1 and 0 are merely given for ease of illustration and represent usual logic values, which may be represented by any desired current levels or voltage levels.

Using the circuit of FIG. 12 and for example the state machine illustrated in FIG. 9, similar to the case of FIG. 11, the following states may be evaluated:

all pins are in a defined condition low or high (0 or 1), or one pin is floating while the other terminal is high (1).

It should be noted that the above-described embodiments serve only as examples, and specific circuit implementations are given only for illustrative purposes. Other implementations are equally possible. Therefore, the above-described embodiments are not to be construed as limiting in any way.

What is claimed is:

1. A device, comprising:
a power switch,
a control terminal,
at least one load terminal,
at least one output terminal, and
a detection circuit configured to detect a high impedance state of the control terminal and to output an error signal at the at least one output terminal in case a high impedance state is detected, wherein the detection circuit is further configured to serve as an input buffer for the control terminal.

2. The device of claim 1, wherein the control terminal comprises at least one of an input terminal to control switching of the power switch, a diagnosis terminal to enable a diagnosis function, and a diagnosis select terminal to select a channel for a diagnosis function.

3. The device of claim 1, wherein the device is integrated on a single chip.

4. The device of claim 1, wherein the detection circuit comprises a first pull element configured to pull a voltage level at the at least one control terminal to a first voltage level, and a switchable second pull element configured to pull the voltage level at the at least one control terminal to a second voltage different from the first voltage level when the switchable pull element is activated.

5. The device of claim 4, wherein the detection circuit is configured to activate the selectable pull element if the voltage level of the control terminal is low and a voltage level of a further control terminal of the device is high.

6. The device of claim 4, wherein the first pull element comprises a pull-down resistor and the second pull element comprises a pull-up resistor.

7. The device of claim 6, wherein a resistance value of the pull-up resistor is smaller than a resistance value of the pull-down resistor.

8. The device of claim 1, further comprising at least one of an overcurrent detection circuit, an overvoltage detection circuit or an overtemperature detection circuit.

9. The device of claim 1, further comprising a current measurement circuit, the current measurement circuit being adapted to output a measure of a load current of the power switch in a regular mode of operation.

10. The device of claim 9, wherein the detection circuit is configured to output an error current higher than the measure of the load current when a high impedance state is detected.

11. The device of claim 1, wherein the device is configured to set the power switch to a predefined state in case the detection circuit detects a high impedance state.

12. The device of claim 1, wherein the device comprises a multi-chip device.

13. A method, comprising:
detecting an irregular condition at a control terminal of a power switch device,
detecting the irregular condition when the control terminal is at a low value and another control terminal is at a high value, and
outputting an error signal in case the irregular condition at the control terminal is detected.

14. The method of claim 13, wherein detecting an irregular condition comprises detecting a high impedance state.

15. The method of claim 13, wherein the control terminal comprises one of an input terminal to control switching of the power switch, a diagnosis terminal to enable a diagnosis function, and a diagnosis select terminal to select a channel for a diagnosis function.

16. The method of claim 13, further comprising setting the control terminal to a high impedance state for testing purposes.

17. The method of claim 13, further comprising setting the power switch to a predefined state in case an irregular condition is detected at the control terminal.

18. The method of claim 13, further comprising outputting a measure of a load current flowing across the power switch in a state where no irregular condition is determined.

19. A device, comprising:
a power switch,
a control terminal,
at least one load terminal,
at least one output terminal,
a detection circuit configured to detect a high impedance state of the control terminal and to output an error signal at the at least one output terminal in case a high impedance state is detected, and
a current measurement circuit, the current measurement circuit being adapted to output a measure of a load current of the power switch in a regular mode of operation,
wherein the detection circuit is configured to output an error current higher than the measure of the load current when a high impedance state is detected.

* * * * *